United States Patent
Pyeon

(10) Patent No.: US 7,894,294 B2
(45) Date of Patent: Feb. 22, 2011

(54) OPERATIONAL MODE CONTROL IN SERIAL-CONNECTED MEMORY BASED ON IDENTIFIER

(75) Inventor: Hong-Beom Pyeon, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 217 days.

(21) Appl. No.: 12/352,009

(22) Filed: Jan. 12, 2009

(65) Prior Publication Data

US 2009/0185434 A1 Jul. 23, 2009

Related U.S. Application Data

(60) Provisional application No. 61/022,921, filed on Jan. 23, 2008.

(51) Int. Cl.
*G11C 8/00* (2006.01)
(52) U.S. Cl. ............... 365/230.03; 365/63; 365/230.06; 365/189.11; 711/103; 711/154
(58) Field of Classification Search ............ 365/230.06, 365/63, 230.03, 226, 189.11; 711/103, 154, 711/118
See application file for complete search history.

(56) References Cited

U.S. PATENT DOCUMENTS

| | | | |
|---|---|---|---|
| 5,563,839 A | 10/1996 | Herdt et al. | |
| 5,860,080 A | 1/1999 | James et al. | |
| 6,795,896 B1 | 9/2004 | Hart et al. | |
| 6,940,762 B2 | 9/2005 | Umezawa | |
| 7,200,054 B2 | 4/2007 | Horiguchi et al. | |
| 7,245,177 B2 | 7/2007 | Fujita et al. | |
| 7,277,356 B2* | 10/2007 | Lee et al. ............... | 365/230.06 |
| 7,307,899 B2 | 12/2007 | Khellah et al. | |
| 7,307,907 B2 | 12/2007 | Houston | |
| 7,308,524 B2 | 12/2007 | Grundy et al. | |
| 7,312,635 B2 | 12/2007 | Tanaka et al. | |
| 7,342,816 B2* | 3/2008 | Bartley et al. ............... | 365/63 |
| 2007/0157041 A1 | 7/2007 | Youngs | |
| 2007/0233917 A1* | 10/2007 | Pyeon et al. ............... | 710/100 |
| 2008/0049505 A1* | 2/2008 | Kim et al. ............... | 365/185.11 |

OTHER PUBLICATIONS

Paul Packan, IEDM 2007 Short Course Device and Circuit Interactions, Intel, Jan. 2007.
Kiyoo Itoh, Kenichi Osada and Takayuki Kawahara, Reviews and Future Prospects of Low-voltage Embedded RAMs, Central Research Laboratory, Hitachi, Ltd., Kokubunji, Tokyo 185-8601, Japan, Sep. 2003.
Takeshi Sakata, Kiyoo Itoh, Masashi Horiguchi and Masakazu Aoki, Subthreshold-Current Reduction Circuits for Multi-Gigabit DRAM's, IEEE Journal of Solid-State Circuits, vol. 29, No. 7, Jul. 1994, Tokyo, Japan.

(Continued)

*Primary Examiner*—Tuan T Nguyen
*Assistant Examiner*—Toan Le
(74) *Attorney, Agent, or Firm*—Ridout & Maybee LLP

(57) ABSTRACT

Applying an adapted block isolation method to serial-connected memory components may mitigate the effects of leakage current in serial-connected non-volatile memory devices. Responsive to determining that a given memory component is not an intended destination of a command, a plurality of core components of the given memory component may be placed in a low power consumption mode, while maintaining input/output components in an active operational mode. Conveniently, aspects of the disclosed system reduce off current without adding many logic blocks into the memory devices.

17 Claims, 8 Drawing Sheets

OTHER PUBLICATIONS

Takeshi Sakata, Kiyoo Itoh, Masashi Horiguchi and Masakazu Aoki, Two-Dimensional Power-Line Selection Scheme for Low Subthreshold-Current Multi-Gigabit DRAM's, IEEE Journal of Solid-State Circuits, vol. 29, No. 8, Aug. 1994, Tokyo, Japan.

Masashi Horiguchi, Takeshi Sakata, and Kiyoo Itoh, Switched-Source-Impedance CMOS Circuit For Low Standby Subthreshold Current Giga-Scale LSI's, IEEE Journal of Solid-State Circuits, vol. 28, No. 11, Nov. 1993, Tokyo, Japan.

Y. Nakagome, M. Horiguchi, T. Kawahara, and K. Itoh, Review and Future Prospects of Low-Voltage RAM Circuits, IBM J. Res. & Dev. vol. 47 No. 5/6, Sep./Nov. 2003.

PCT International Search Report, regarding International application No. PCT/CA2009/000075, dated Apr. 30, 2009.

* cited by examiner

US 7,894,294 B2

OPERATIONAL MODE CONTROL IN SERIAL-CONNECTED MEMORY BASED ON IDENTIFIER

CROSS REFERENCE TO RELATED APPLICATIONS

The present application claims priority to U.S. Provisional Patent Application Ser. No. 61/022,921, filed Jan. 23, 2008, the contents of which are hereby incorporated herein by reference.

FIELD

The present application relates, generally, to control of a serial-connected non-volatile memory system and, more specifically, to operational mode control of components of the memory system based on an identifier.

BACKGROUND

High leakage current in deep sub-micrometer regimes is becoming a significant contributor to power dissipation in Complementary Metal Oxide Semiconductor (CMOS) circuits as threshold voltage ($V_T$), channel length (l) and gate oxide thickness ($t_{ox}$) are reduced. An off current ($I_{off}$) of a transistor includes contributions from at least four types of currents: Gate Leakage current; Junction Leakage current; Source/Drain (S/D) Leakage current; and Band-to-Band Tunneling (SD Edge) current. The leakage currents are generally caused by a voltage difference between two discontinuous media. The detrimental effect of all four types of currents has been enhanced recently as advances are made in the field of shrinking the physical size of CMOS transistors. Minimizing the four types of currents that contribute to the transistor off current has become one of the major issues in all new transistor developments. The transistor off current includes another leakage current, called "sub-threshold leakage current", which, as the physical size of CMOS transistors shrinks, has been increasing more than the other leakage currents, relatively.

BRIEF DESCRIPTION OF THE DRAWINGS

Reference will now be made to the drawings, which show by way of example, embodiments, and in which.

DETAILED DESCRIPTION OF THE EMBODIMENTS

Figure 1:
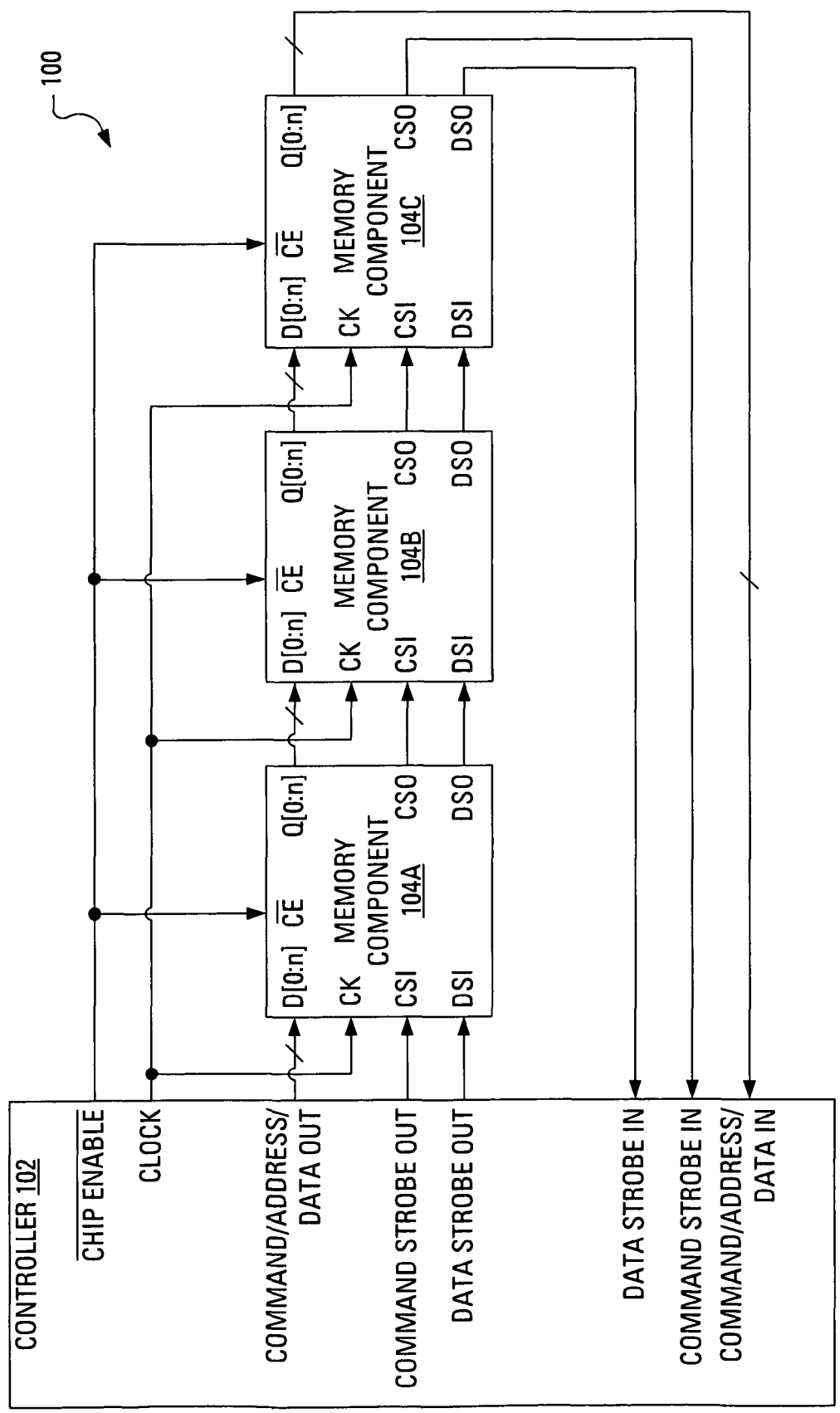
FIG. 1 illustrates a memory system arranged as a ring of memory components.

To reduce the Direct Current (DC) power consumption that occurs as a result of the transistor off current, power switches have been considered for use in high speed applications like Double Data Rate (DDR) memories and Static Random Access Memory (SRAM). So far, developers of NAND flash memories have appeared not to have considered any methods to reduce DC power consumption resulting from transistor off current. Since the transistors used in NAND flash memories are not categorized as high speed transistors, the input and output path performance have not been considered as issues. However, in case of a NAND flash memory with a serial-connected memory system employing up-to-date high speed transistors, power consumption due to the transistor off current may be recognized as a problem.

It is known that individual memory components of a memory system arranged with multi-drop connections may be placed in a low power consumption operational mode (i.e., a "sleep" operational mode). For example, a memory component in a memory system arranged with multi-drop connections to memory components may be isolated with an NMOS power transistor to control the path of the power line. Static Read Only Memory (SRAM) systems generally have more transistors that act as a storage elements than other memory systems. Accordingly, minimization of leakage current from the transistor off-state is a more critical issue for SRAM systems than for other memory cells. Therefore, there exists a block isolation method for use in low-power SRAM products. The block isolation method attempts to minimize leakage current in unselected blocks using so-called "sleep mode transistors". By this approach, it has been shown that the leakage current caused by sub-threshold leakage current can be reduced drastically. Generally, the logic for controlling an operational mode of a memory component, between an active operational mode and a sleep operational mode, is carried out by a command assertion or an external pin. In one example, a controller may raise the external pin to a voltage level to select either the active operational mode or the sleep operational mode.

However, unlike memory systems arranged with multi-drop connections to memory components, memory systems in which each of the memory components is connected serially require that input and output ports be turned on to receive and transmit command and data packets. More particularly, all memory components on the serial-connected system are required to be connected to a main power line, even though some memory components (i.e., those memory components having an identifier that does not match an identifier associated with a received command packet) are not operated.

Upon power up of a memory system in which each of the memory components is connected serially, a controller assigns a memory component identifier to each memory component. The controller may issue a command to a single memory component of the memory system by transmitting a command packet that includes, for example, a memory component identifier (e.g., a destination address), an operation code and a specific address within the memory of the memory component referenced by the identifier.

It may be considered that the current consumed by input components and output components to receive and transmit command and data packets may not be avoided in the serial-connected memory system. However, unused components of the unselected memory components, that is, components distinct from the above-mentioned input components and output components, can be placed in a sleep operational mode and disconnected electrically from the main power. Main power is often referenced as drain supply voltage ($V_{DD}$) and source supply voltage ($V_{SS}$).

Application of an adapted block isolation method to serial-connected memory components may be used to mitigate the effects of leakage current in serial-connected non-volatile memory devices. Conveniently, aspects of the disclosed system reduce off current ($I_{off}$) without adding many logic blocks into the memory devices.

In accordance with an embodiment, there is provided a serial-connected memory system. The serial-connected memory system includes a serial-connected memory component. The serial-connected memory component includes a plurality of input components, a plurality of output components, a plurality of core components, a control circuit adapted to, responsive to receiving a predetermined signal, place the plurality of core components into a low power consumption operational mode, while leaving the plurality of input components and the plurality of output components in an active operational mode and a comparator adapted to generate the predetermined signal responsive to determining that an identification value associated with the memory component does not match an identification value decoded from a memory component identifier present in a received command packet.

In accordance with an embodiment, there is provided a method of managing an operational mode of memory component in a serial-connected memory system. The method includes receiving a command, wherein the command includes a memory component identifier, decoding the memory component identifier to obtain a command identification value, obtaining a stored identification value associated with the memory component, determining that the stored identification value does not match the command identification value and responsive to the determining, placing a plurality of core components of the memory component in a low power consumption mode.

Other aspects and features of the present application will become apparent to those of ordinary skill in the art upon review of the following description of specific embodiments in conjunction with the accompanying figures.

A memory system 100 is illustrated in FIG. 1 and includes a first memory component 104A, a second memory component 104B and a third memory component 104C (collectively or individually 104) arranged in a ring or loop. Operation of any one of the memory components 104 for writing or reading is organized by a controller 102.

The controller 102 is connected to the first memory component 104A by way of a Command Strobe Line, a Data Strobe Line and a Data bus. Similarly, the first memory component 104A is connected to the second memory component 104B by way of a Command Strobe Line, a Data Strobe Line and a Data bus. It follows that the second memory component 104B is connected to the third memory component 104C by way of a Command Strobe Line, a Data Strobe Line and a Data bus. Finally, the third memory component 104C is connected to the controller 102 by way of a Command Strobe Line, a Data Strobe Line and a Data bus. The controller 102 is also connected to each of the memory components 104, in parallel, by an inverse Chip Enable line and a Clock line.

Figure 2:
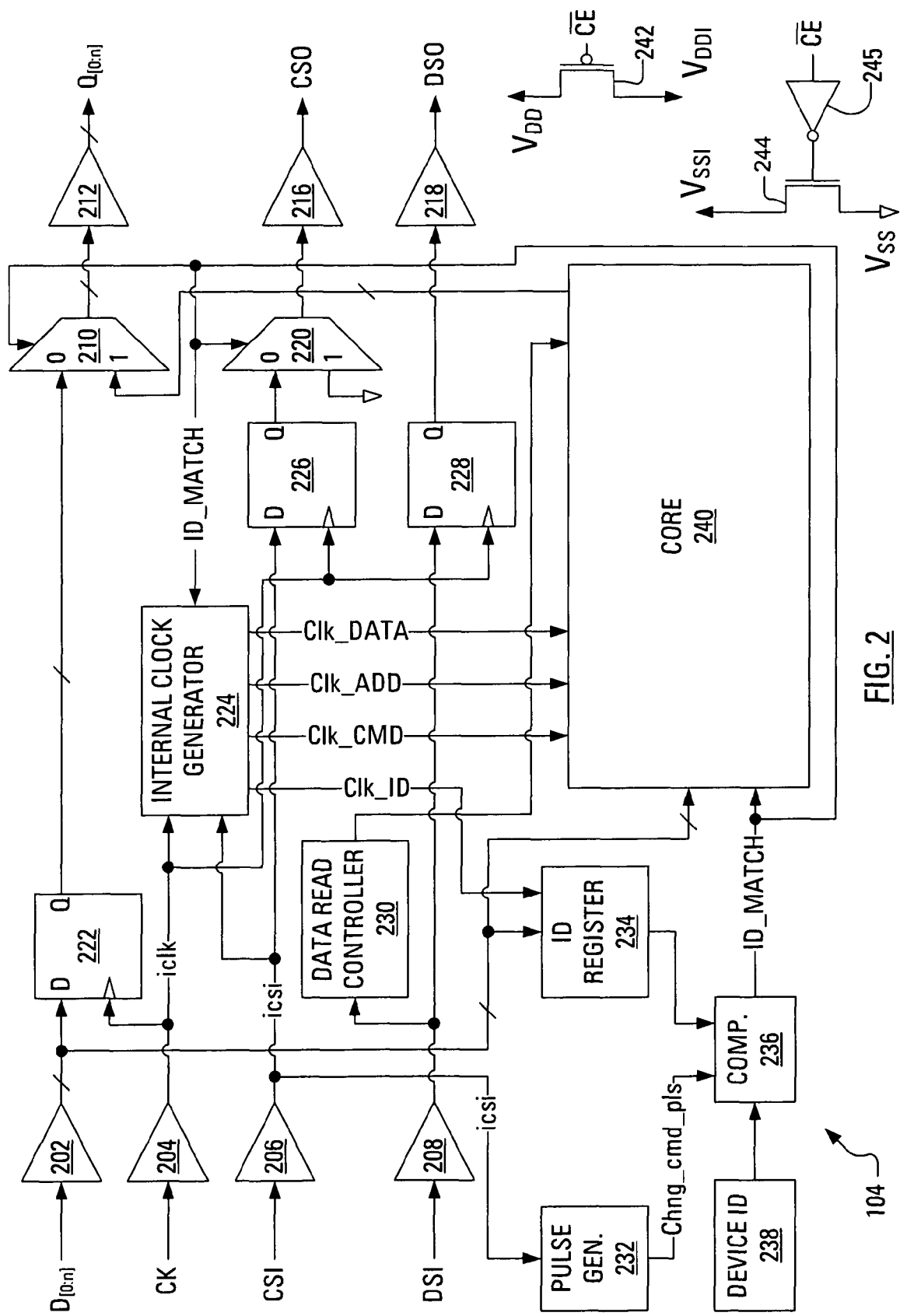
FIG. 2 illustrates an individual memory component of the memory system of FIG. 1, according to an embodiment, the memory component includes an input/output component and a core block, the components of the memory component receive a drain supply voltage, $V_{DD}$, and a source supply voltage, $V_{SS}$.

FIG. 2 illustrates components that comprise an example memory component 104 from among the memory components 104 of the memory system 100 illustrated in FIG. 1.

The example memory component 104 includes a command strobe input buffer 206 for receiving the Command Strobe Line (CSI), a data strobe input buffer 208 for receiving the Data Strobe Line (DSI) and a data input buffer 202 for receiving input from the Data bus ($D_{[0:n]}$). Additionally, a clock input buffer 204 receives the clock line (CK) and produces an output signal labeled "iclk".

Output from the data input buffer 202 is received at the D input of a first D-type flip flop 222 with the clock input of the first D-type flip flop 222 receiving iclk from the clock input buffer 204.

Output from the command strobe input buffer 206 is received at the D input of a second D-type flip flop 226 with the clock input of the second D-type flip flop 226 receiving iclk from the clock input buffer 204.

Output from the data strobe input buffer 208 is received at the D input of a third D-type flip flop 228 with the clock input of the third D-type flip flop 228 receiving iclk from the clock input buffer 204.

Output from the data input buffer 202 is also received at an ID register 234 and a core 240.

Output from the command strobe input buffer 206 is also received at a pulse generator 232.

A comparator 236 receives the output of the ID register 234, the pulse generator 232 and a memory 238 that stores an identification value for the example memory component 104. The output of the comparator 236, which output is given the label "ID_MATCH", is passed to the core 240.

Output from the data strobe input buffer 208 is also received at a data read controller 230. Output from the data read controller 230 is received at the core 240.

Output from the command strobe input buffer 206 is also received at an internal clock generator 224. The internal clock generator 224 also receives iclk from the clock input buffer 204 and the ID_MATCH signal from the comparator 236. An output, labeled "Clk_ID", from the internal clock generator 224, is received at the ID register 234. Three further outputs, labeled "Clk_CMD", "Clk_ADD" and "Clk_DATA", from the internal clock generator 224, are received at the core 240.

The Q output from the first D-type flip flop 222 is received at a 0 input of a first selector 210. A 1 input of the first selector 210 receives input from the core 240. The first selector 210 is triggered by the ID_MATCH signal from the comparator 236. The output of the first selector 210 is received by a data output buffer 212.

The Q output from the second D-type flip flop 226 is received at a 0 input of a second selector 220. A 1 input of the second selector 220 is connected to $V_{SS}$. The second selector 220 is triggered by the ID_MATCH signal from the comparator 236. The output of the second selector 220 is received by a command strobe output buffer 216.

The Q output from the third D-type flip flop 228 is received at a data strobe output buffer 218.

A first PMOS (p-channel Metal Oxide Semiconductor) transistor 242 has its source connected to $V_{DD}$ and its gate connected to the inverse Chip Enable line. The signal on the drain of the first PMOS transistor 242 is labeled $V_{DDI}$. A first NMOS (n-channel Metal Oxide Semiconductor) transistor 244 has its source connected to $V_{SS}$ and its gate connected to the inverse Chip Enable line through an inverter 245. The signal on the drain of the first NMOS transistor 244 is labeled V$_{SSI}$. Any of the non-core, input and output components that would normally be connected to V$_{DD}$ are, instead, connected to V$_{DDI}$. Similarly, any of the non-core, input and output components that would normally be connected to V$_{SS}$ are, instead, connected to V$_{SSI}$.

Figure 3:
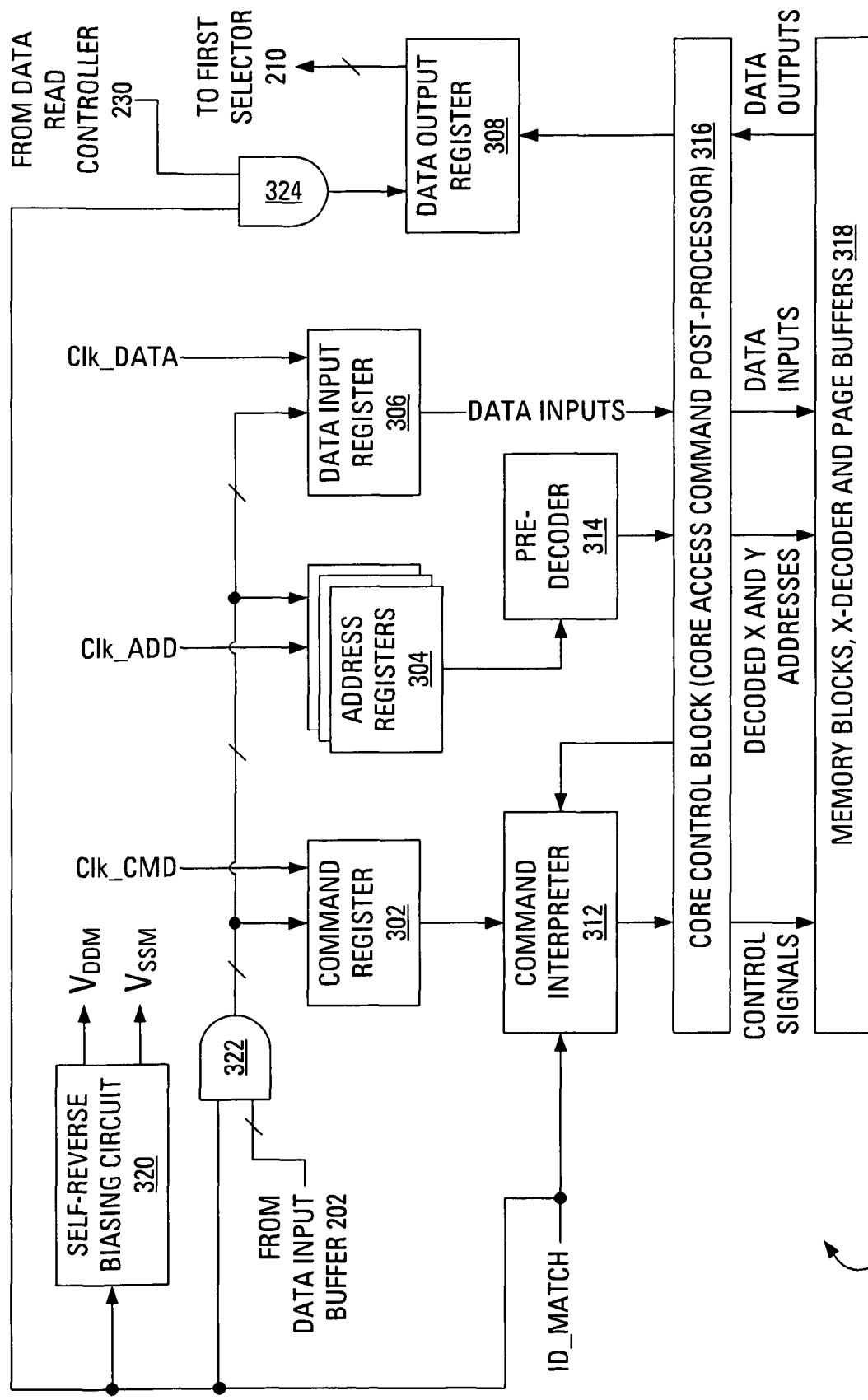
FIG. 3 illustrates the core block of the memory component of FIG. 2, the components of the core block receive a modified drain supply voltage, $V_{DDM}$, and a modified source supply voltage, $V_{SSM}$, where voltage levels for $V_{DDM}$ and $V_{SSM}$ are controlled at a self-reverse biasing circuit as a function of an ID_MATCH signal.

The components of the core 240 may be considered in schematic form in review of FIG. 3. In particular, a command register 302 receives input through an AND gate 322 from the data input buffer 202 and Clk_CMD from the internal clock generator 224. A set of address registers 304 receive input from the data input buffer 202 and Clk_ADD from the internal clock generator 224. Output from the set of address registers 304 is received at a pre-decoder 314, whose output is received by a core control block (i.e., core access command post-processor) 316.

A data input register 306 receives input from the data input buffer 202 and Clk_DATA from the internal clock generator 224.

A command interpreter 312 receives output from the command register 302, the ID_MATCH signal from the comparator 236 (FIG. 2) and feedback from the core control block 316 and provides output to the core control block 316.

Along with output from the command interpreter 312, the core control block 316 also receives output from the pre-decoder 314 and data inputs from the data input register 306. The core control block 316 provides control signals, decoded X and Y addresses and data inputs to a group component 318 that groups together memory blocks, an X-decoder and page buffers.

The group component 318 returns data outputs to the core control block 316. In turn, the core control block 316 provides output to a data output register 308, which also receives input from the data read controller 230 (FIG. 2) through an AND gate 324. The data output register 308 provides its output to the 1 input of the first selector 210 (FIG. 2).

The ID_MATCH signal is also received at a control circuit, illustrated in FIG. 3 as a self-reverse biasing circuit 320, the output of which is a core drain supply voltage labeled V$_{DDM}$ and a core source supply voltage labeled V$_{SSM}$.

Use of the self-reverse biasing circuit 320 is based on consideration, by some, that Metal Oxide Semiconductor Field Effect Transistor (MOSFET) threshold voltage (V$_T$) scaling is an issue in the simultaneous achievement of low-voltage operation and high-speed operation. The high-speed operation of CMOS circuits may be seen to necessitate a scaled-down V$_T$ because the speed of a CMOS circuit is roughly inversely proportional to V$_{DD}$-V$_T$. However, when V$_T$ becomes small enough to no longer cut off the MOSFET, a MOSFET sub-threshold DC current is developed, which increases exponentially with decreasing V$_T$. To reduce the sub-threshold current, diverse methods have been proposed. Indeed, the diverse methods are being used in many products. Many consider that the best way to reduce the sub-threshold current is to increase V$_T$ electrically.

Leakage current, I$_{leak}$, may be expressed as $$I_{leak} \propto \exp\left[\pm \frac{V_{GS} - V_T - K(\sqrt{V_{BS} + 2\Psi} - \sqrt{2\Psi}) + \lambda V_{DS}}{\frac{S}{\ln 10}}\right] \times \left\{1 - \exp\left[-\frac{qV_{DS}}{kT}\right]\right\}, \quad (0.1)$$

where plus values refer to n-MOSFETs and minus values to p-MOSFETs, V$_T$ is the actual threshold voltage, S is sub-threshold swing, K is the body-effect coefficient and λ is a Drain-Induced Barrier Lowering (DIBL) factor. Here, q is the electronic charge, k is the Boltzmann constant and T is the absolute temperature. Usually I$_{leak}$ is reduced by 90% with a V$_T$ increment of only 0.1 V (i.e., S=0.1 V/decade at 100° C.).

One way of obtaining a high-V$_T$ MOSFET from a low-actual-V$_T$ MOSFET involves increasing the doping level of the MOSFET substrate. Another way of obtaining a high-V$_T$ MOSFET from a low-actual-V$_T$ MOSFET involves applying reverse biases. It can be shown that the selective use of high-V$_T$ MOSFETs in low-actual-V$_T$ circuits may decrease circuit sub-threshold currents. Additionally, it can be shown that the reverse biasing of low-actual-V$_T$ circuits can decrease sub-threshold currents.

There have been many attempts to develop reverse-biasing schemes. The reverse-biasing schemes can be generally categorized as: a gate-source (V$_{GS}$) reverse-biasing scheme; a substrate-source (V$_{BS}$) reverse-biasing scheme; or a drain-source voltage (V$_{DS}$) reduction scheme. Reverse-biasing schemes in the V$_{GS}$ reverse-biasing scheme category can be further categorized as either "V$_S$-control with a fixed V$_G$" or "V$_G$-control with a fixed V$_S$". Reverse-biasing schemes in the V$_{BS}$ reverse-biasing scheme category can be further categorized as either "V$_B$-control with a fixed V$_S$" or "V$_S$-control with a fixed V$_B$".

The reduction efficiency, r$_1$, of the V$_G$-control with a fixed V$_S$ category of the V$_{GS}$ reverse-biasing schemes may be determined as a ratio of I$_{leak}$ without V$_{GS}$ reverse bias to I$_{leak}$ with V$_{GS}$ reverse bias, $$r_1 = \frac{I_{leak}(V_{GS} = 0)}{I_{leak}(V_{GS} = -\delta)} = e^{\left(\frac{\delta}{\frac{S}{\ln 10}}\right)}. \quad (0.2)$$

Equation (0.2) illustrates that the I$_{leak}$ with V$_{GS}$ reverse bias is significantly reduced relative to the I$_{leak}$ without V$_{GS}$ reverse bias.

The self-reverse biasing circuit 320 may be used to control the operational mode of the core 240. Accordingly, the V$_G$-control with a fixed V$_S$ category of the V$_{GS}$ reverse-biasing scheme may be selected for self-reverse biasing circuit 320. Other schemes may also be adapted to control the operational mode of the core 240, given a proper combination of circuits and logic.

Figure 4A:
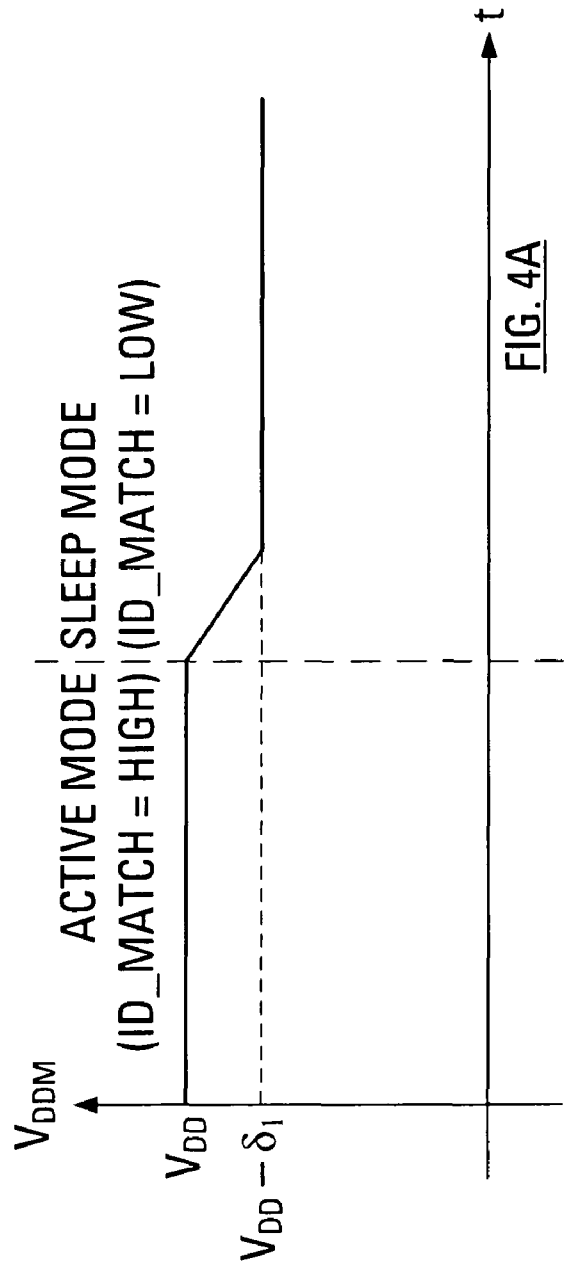
FIG. 4A illustrates a relationship between $V_{DDM}$, $V_{DD}$ and the ID_MATCH signal.

A relationship between V$_{DDM}$, V$_{DD}$ and the ID_MATCH signal is illustrated in FIG. 4A. When the ID_MATCH signal is HIGH, V$_{DDM}$=V$_{DD}$ and the core 240 operates in an active operational mode. After the ID_MATCH signal has changed from HIGH to LOW, V$_{DDM}$=V$_{DD}$-δ$_1$ and, responsively, the core 240 enters into a sleep operational mode.

Figure 4B:
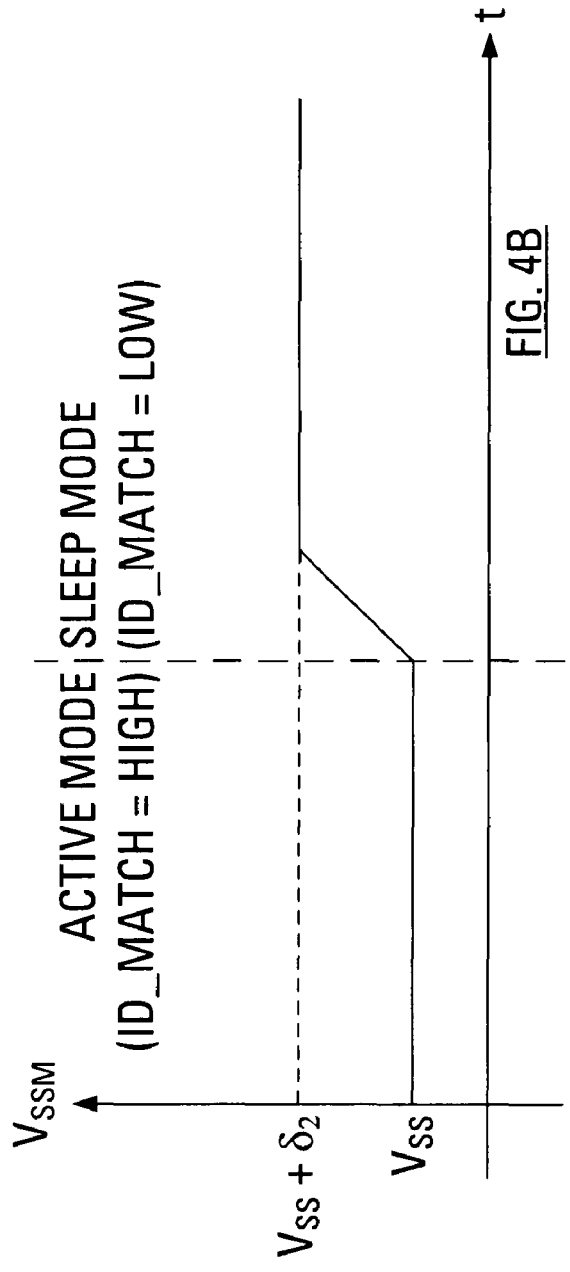
FIG. 4B illustrates a relationship between $V_{SSM}$, $V_{SS}$ and the ID_MATCH signal.

A relationship between V$_{SSM}$, V$_{SS}$ and the ID_MATCH signal is illustrated in FIG. 4B. When the ID_MATCH signal is HIGH, the core 240 is in an active operational mode and V$_{SSM}$=V$_{SS}$. After the ID_MATCH signal has changed from HIGH to LOW, V$_{SSM}$=V$_{SS}$+δ$_2$ and, responsively, the core 240 enters into a sleep operational mode.

Figure 5:
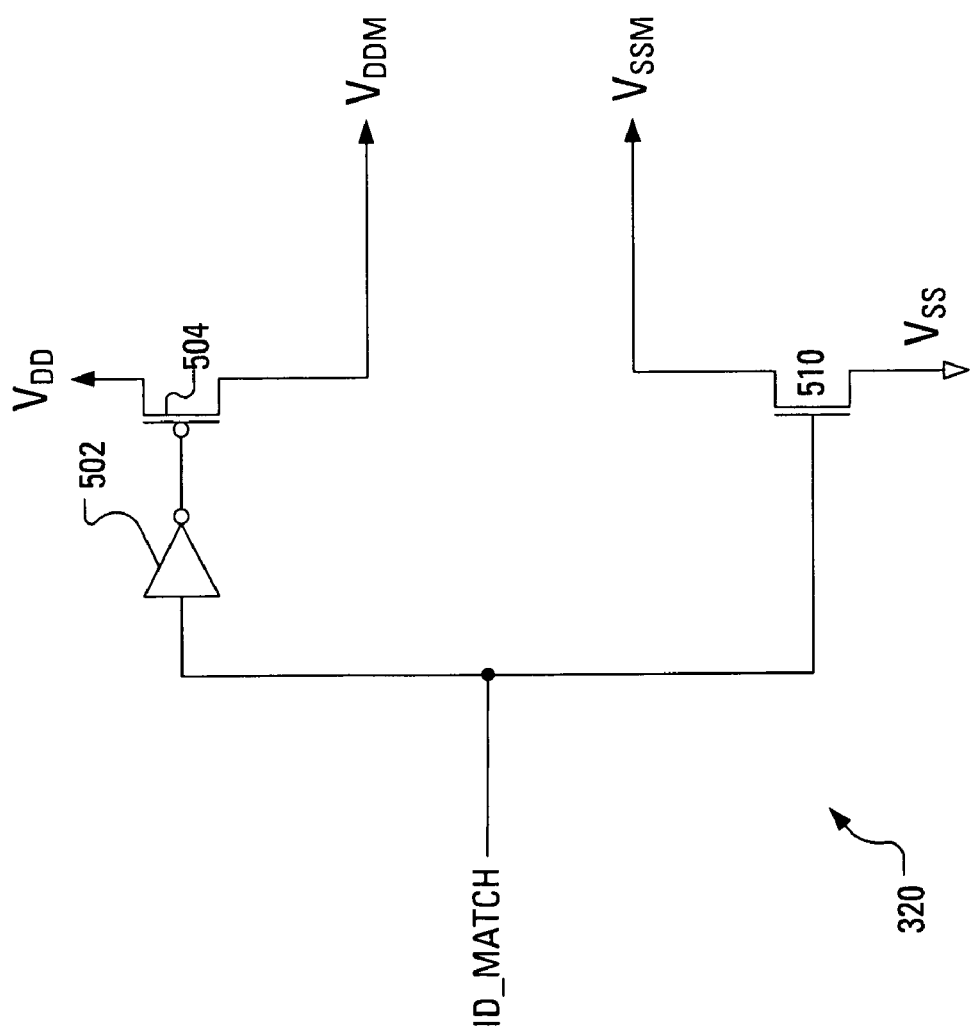
FIG. 5 illustrates an example structure for the self-reverse biasing circuit of FIG. 3.

An example structure for the self-reverse biasing circuit 320 is illustrated in FIG. 5. The ID_MATCH signal is received by an inverter 502. The output of the inverter 502 is received at the gate of a PMOS power switch 504 having a source connected to supply voltage V$_{DD}$ and drain providing V$_{DDM}$. The gate of an NMOS power switch 510 receives the ID_MATCH signal, the source of the NMOS power switch 510 is connected to the supply voltage $V_{SS}$ and the drain provides $V_{SSM}$.

In order for power savings to be realized using the self-reverse biasing technique described herein, logic circuits such as those in the core 240 must be in the same predetermined logic state each time a sleep mode is entered. In FIG. 3, the AND gates 322, 324 set each of the downstream logic circuits in a predetermined state when ID_MATCH is low. A topology of each logic circuit within each element 302, 304, 306, 312, 314, 316, 318 of the core 240 is chosen according to the predetermined state to which the logic circuit is set during sleep mode.

Figure 6B:
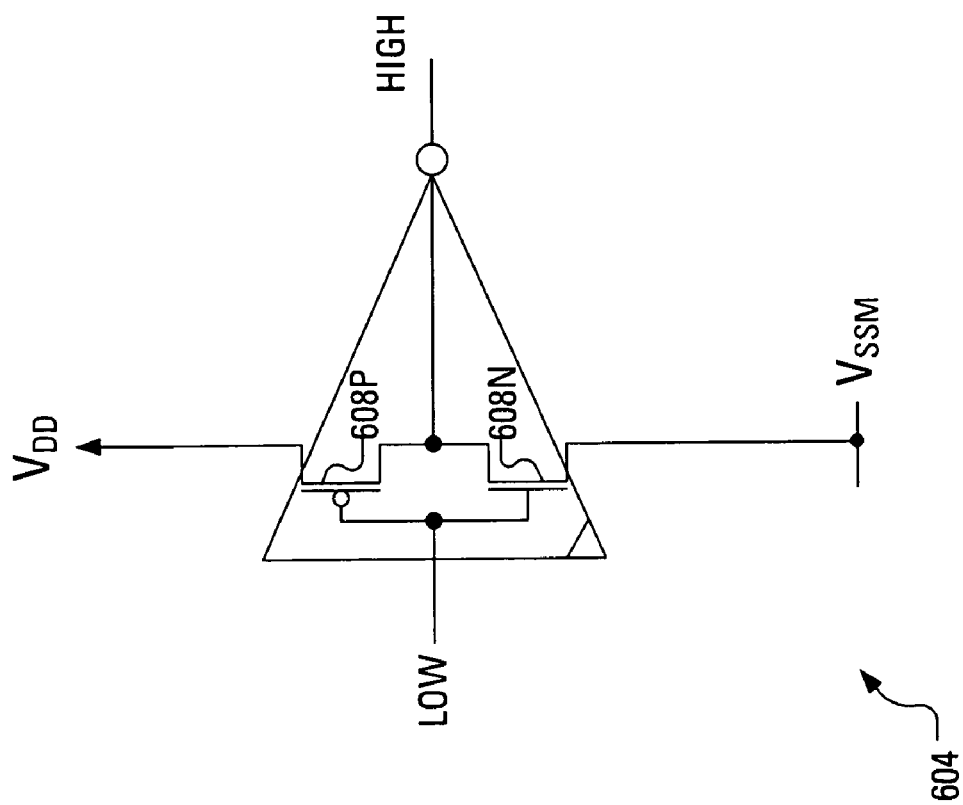
FIG. 6B illustrates a further example structure for an inverter for use with the biasing circuit of FIG. 5.
Figure 6A:
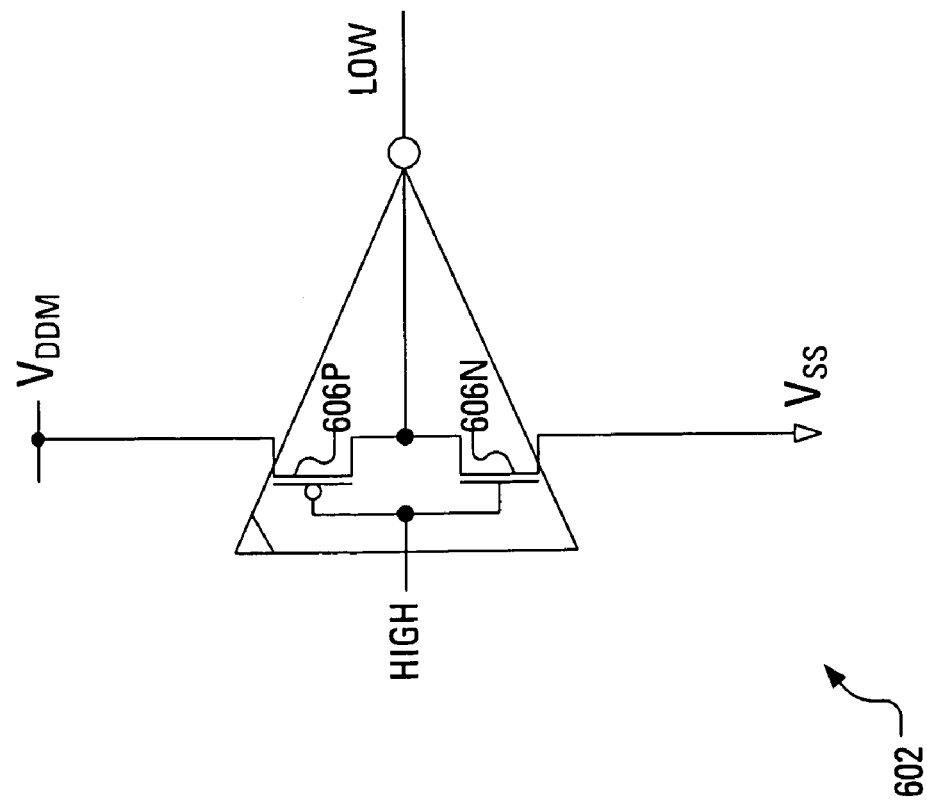
FIG. 6A illustrates an example structure for an inverter for use with the biasing circuit of FIG. 5.

For example, referring now to FIG. 6A, an inverter 602 that is set to a predetermined state of LOW output is chosen to have a topology wherein the source of a P-channel transistor 606P is connected to $V_{DDM}$ instead of a conventional topology wherein the source of the P-channel transistor 606P would be connected to $V_{DD}$. Analogously, referring to FIG. 6B, an inverter 604 that is set to a predetermined state of HIGH output is chosen to have a topology wherein the source of an N-channel transistor 608N is connected to $V_{SSM}$ instead of a conventional topology wherein the source of the N-channel transistor 608N would be connected to $V_{SS}$.

Figure 7B:
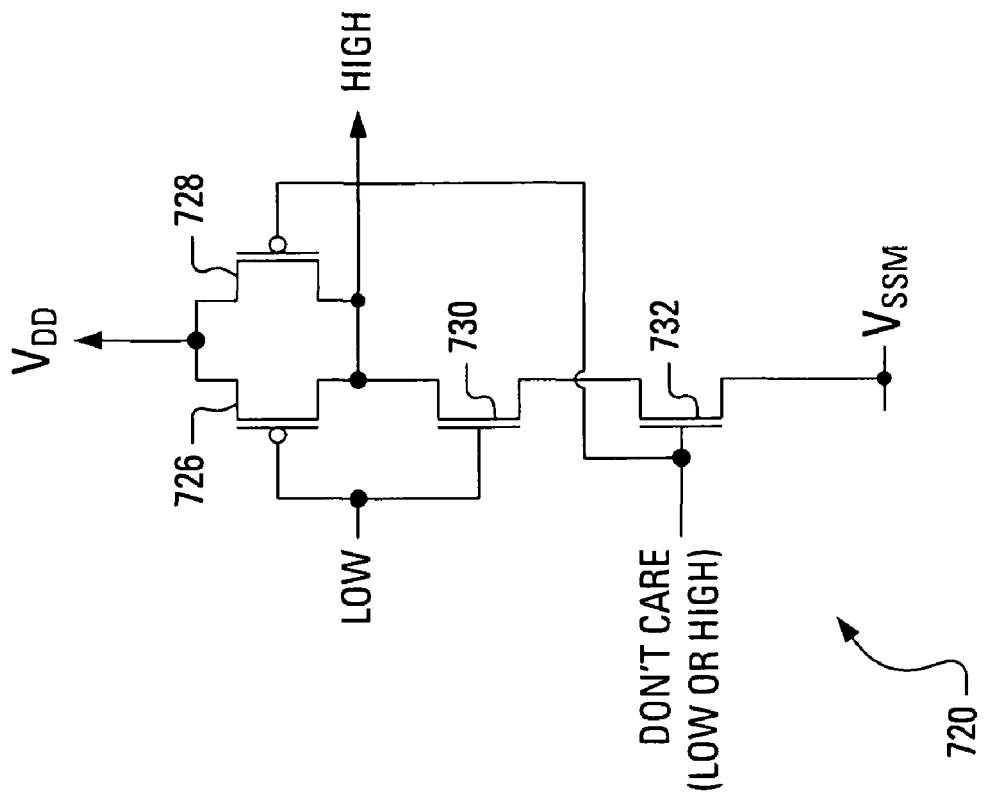
FIG. 7B illustrates a further example structure for a NAND gate for use with the biasing circuit of FIG. 5.
Figure 7A:
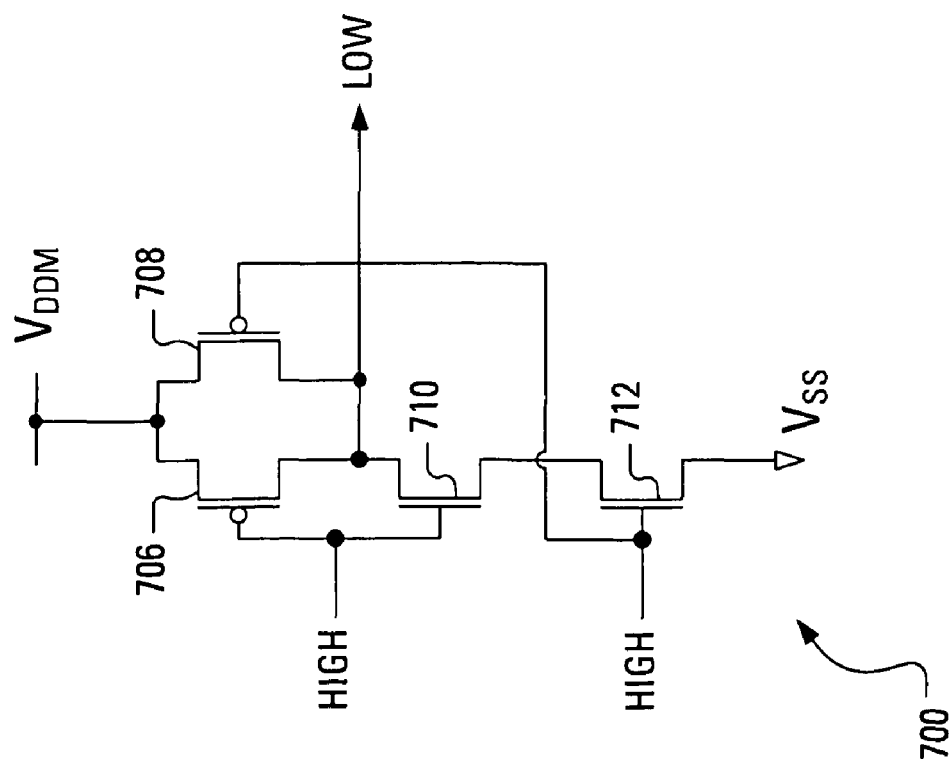
FIG. 7A illustrates an example structure for a NAND gate for use with the biasing circuit of FIG. 5.

Referring to FIG. 7A, a NAND gate 700 that is set to a predetermined state of LOW output is chosen to have a topology wherein the sources of two P-channel transistors 706, 708 are connected to $V_{DDM}$ instead of a conventional topology wherein the sources of the P-channel transistors 706P, 708P would be connected to $V_{DD}$. Likewise, referring to FIG. 7B, a NAND gate 720 that is set to a predetermined state of HIGH output is chosen to have a topology wherein the source of an N-channel transistor 732 is connected to $V_{SSM}$ instead of a conventional topology wherein the source of the N-channel transistor 732 would be connected to $V_{SS}$.

A person of skill in the art will appreciate that any other type of logic circuit, such as NOR gates, flips flops, or latches (not shown), can have a topology chosen analogous to the examples shown in FIGS. 6A, 6B, 7A and 7B.

Recall that each memory component 104 in the serial-connected memory system 100 of FIG. 1 is required to have input components and output components that are "always on" to receive command packets issued from the controller 102 and to transmit received command packets. Furthermore, the input components and the output components of a selected memory component 104 may be used to respectively receive and transmit read results in data packets. Operational mode control solutions for memory components of existing memory systems arranged with multi-drop connections are arranged to place entire non-selected memory components in sleep mode. Clearly, operational mode control solutions for multi-drop memory systems are unsuitable for the memory components 104 in the serial-connected memory system 100 which are required to have particular components "always on".

As discussed, the example memory component 104 of the serial-connected memory system 100 of FIG. 1 uses the data input buffer 202 (FIG. 2) to receive command packets and, accordingly, the data input buffer 202 should be enabled if power is on for the serial-connected memory system 100. Similarly, the example memory component 104 uses the data output buffer 212 to transmit command packets and, accordingly, the data output buffer 212 should be enabled if power is on for the serial-connected memory system 100. Additionally, logic components related to input and output should also be enabled if power is on for the serial-connected memory system 100. However, as will be clear to a person of ordinary skill in the art, logic components unrelated to input and output (e.g., logic components in the core 240) need not be enabled in the memory components 104 that are not selected.

In overview, by controlling unselected memory components to selectively place logic components into a sleep operational mode, it is expected that a reduction in the sub-threshold current may be realized for the entire serial-connected memory system 100.

In review of FIG. 2, it may be noted that the internal clock generator 224, the first selector 210, the second selector 220 and the core 240 are arranged to receive the ID_MATCH signal.

The power line, $V_{DDM}$, which, as illustrated in FIG. 4A, is lower than $V_{DD}$ by $\delta_1$ when the related memory component 104 is in sleep mode, may be shown to have high capacitive loading. Similarly, the power line, $V_{SSM}$, which, as illustrated in FIG. 4B, is higher than $V_{SS}$ by $\delta_2$ when the related memory component 104 is in the sleep operational mode, may be shown to have high capacitive loading. Accordingly, the magnitudes of $\delta_1$ and $\delta_2$ should be, somehow, minimized to obtain fast $V_{DD}$ and $V_{SS}$ level restoration in case of the ID_MATCH signal transitioning to HIGH responsive to the selection of the memory component 104.

The logic components of the core 240 have two operational modes: active operational mode; and sleep operational mode. Determination of a given operational mode for the logic components of the core 240 is achieved through control, using the ID_MATCH signal, of $V_{DDM}$ and $V_{SSM}$.

Determination of a given operational mode for the non-core components of the memory component 104 of FIG. 2 is achieved through control, using the inverse Chip Enable line, of $V_{DDI}$ (on the drain of the first PMOS transistor 242) and $V_{SSI}$ (on the drain of the first NMOS transistor 244).

Accordingly, it may be considered that logic component control is "separated" so that the operation mode of non-core logic components is controlled separately from the operation mode of logic components in the core 240.

Using such separated logic component control for each memory component 104, the serial-connected memory system 100 of FIG. 1 can have low power operations without increasing $I_{off}$ relative to $I_{leak}$, even when carrying out low $V_{DD}$ operations with low $V_T$ transistors. So as to achieve this benefit practically, the level $\delta$ may be controlled through appropriate design of the PMOS power switch 604 and the NMOS power switch 610. The magnitude of $\delta_1$ depends on the total junction capacitance, $C_{junction}$, the line capacitances of the power line, $C_{line}$, and the total leakage of the PMOS power switch 604. Similarly, the magnitude of $\delta_2$ depends on the total junction capacitance, $C_{junction}$, the line capacitances of the power line, $C_{line}$, and the total leakage of the NMOS power switch 610.

Notably, there is a recovery time related to $V_{DDM}$, i.e., the time required for the level to return to $V_{DD}$ from $V_{DDM}$ responsive to entering the active operational mode. There is also a recovery time related to $V_{SSM}$, i.e., the time required for the level to return to $V_{SS}$ from $V_{SSM}$ responsive to entering the active operational mode. These recovery times are established based on power switch performance and total capacitance of the $V_{DDM}$ and $V_{SSM}$ power lines. The recovery time can be expressed as:

$$T_{recovery} = (C_{junction} + C_{line})\frac{\delta}{I_{sat}}, \qquad (0.3)$$

where $I_{sat}$ is a power switch saturation current.

Figure 8:
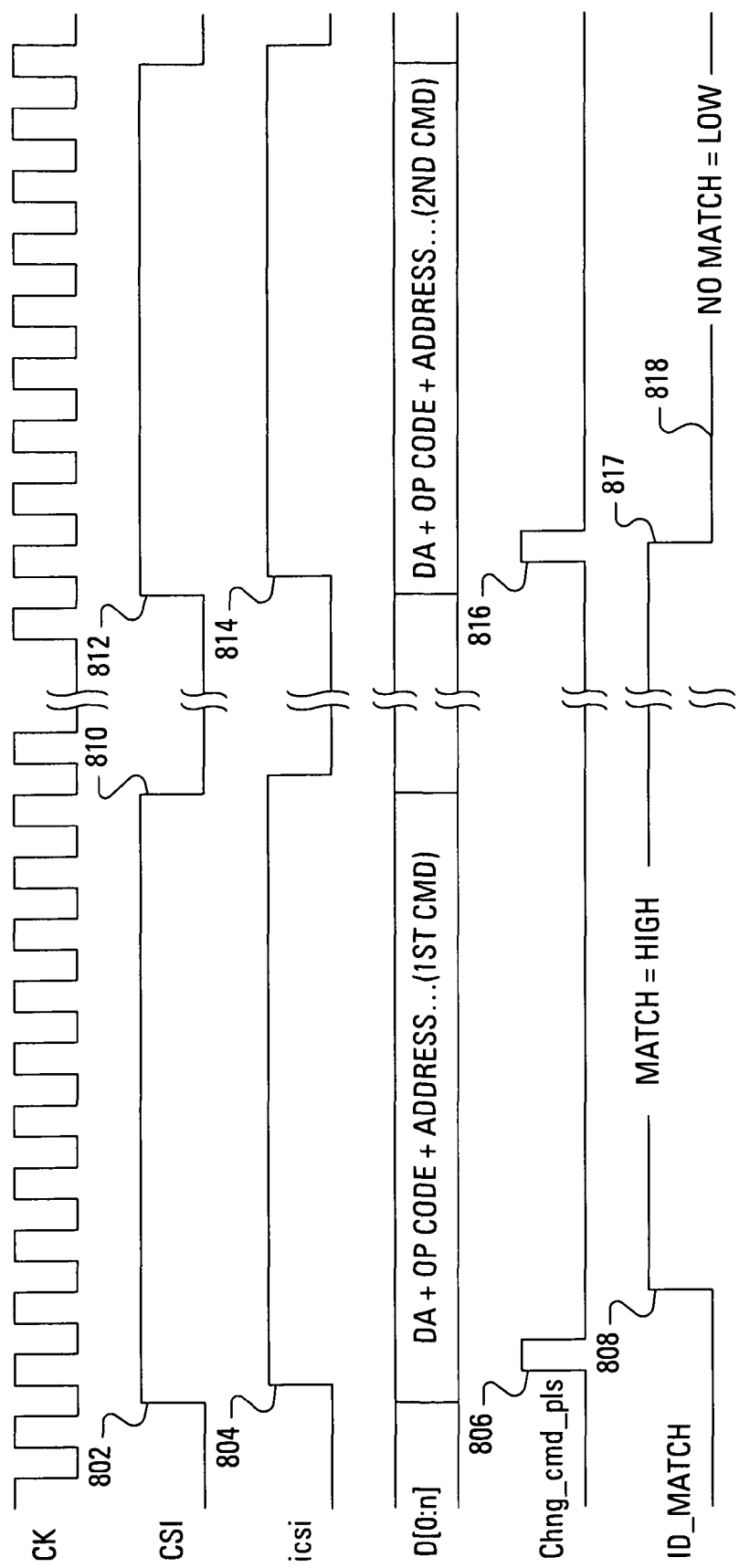
FIG. 8 illustrates a timing diagram for the memory component of FIG. 2.

FIG. 8 illustrates timing of signals, for an example memory component 104, including a clock signal (CK), a command strobe input signal (CSI), an internal command strobe input signal (icsi), an input data signal (D[0:n]), a change command pulse signal (Chng_cmd_pls) and an ID_MATCH signal.

In operation, at a point in time identified by reference 802, the command strobe input signal is asserted by the controller 102 and is received at the command strobe input buffer 206. Simultaneously, a first command packet begins arriving at the data input buffer 202. The first command packet includes, for example, a memory component identifier, an operation code and a specific address within the memory of the memory component 104 specified by the memory component identifier. The first command packet may also include data.

Responsive to the asserted command strobe input signal and a rising clock edge, the command strobe input buffer asserts (at time 804) the internal command strobe input (icsi) signal and the pulse generator 232 produces (at time 806) a pulse on the change command pulse signal (Chng_cmd_pls).

Contemporaneously, the ID register 234 obtains, from the data input buffer 202, the memory component identifier present in the first command packet. The ID register 234 decodes the memory component identifier and passes a command ID value, which has been decoded from the memory component identifier, to the comparator 236. The comparator 236 also receives a device ID from the memory 238 and compares the command ID value received from the ID register 234 to the device ID received from the memory 238.

Upon the falling edge of the clock signal following the end of the change command pulse signal (at time 808), the comparator 236 produces either a logical HIGH level or a logical LOW level as the ID_MATCH signal. The comparator 236 produces a logical HIGH level for the ID_MATCH signal when the command ID value received from the ID register 234 matches the device ID received from the memory 238. It is assumed, for illustration purposes in FIG. 8, that the memory component identifier in the first command packet corresponds to the example memory component 104.

When the ID_MATCH signal is changed from logical LOW to logical HIGH, $V_{DDM}$ and $V_{SSM}$ start recovering to the levels $V_{DD}$ and $V_{SS}$ respectively. The allowable recovery time depends on the full speed of the serial-connected memory system 100 and the bit-width of the input data signal. In the case of fully serial signal (data width=1), there is a lot of timing margin from the ID_MATCH signal change to the full power level recovery. However, in case of an input data signal eight bits wide, there should be an internal latency control register to hold the input bit streams that are processed in the main logic components. In this application, the details for internal latency control methods are not included.

Where the comparator 236 has produced a logical HIGH level for the ID_MATCH signal, the example memory component 104 enters the active operational mode and, more particularly, the core 240 enters the active operational mode. In the active operational mode, the core 240 may operate to process the operation code in the first command packet.

The first command packet has a finite length. Upon completion of transmission of the first command packet (at time 810), the controller 102 may stop asserting the command strobe input signal.

At a later point in time identified by reference 812, the command strobe input signal is again asserted by the controller 102 and is received at the command strobe input buffer 206. Simultaneously, a second command packet begins arriving at the data input buffer 202. The second command packet includes, for example, a memory component identifier, an operation code and a specific address within the memory of the memory component 104 specified by the memory component identifier. The second command packet may also include data.

Responsive to the asserted command strobe input signal and a rising clock edge, the command strobe input buffer asserts (at time 814) the internal command strobe input (icsi) signal and the pulse generator 232 produces (at time 816) a pulse on the change command pulse signal (Chng_cmd_pls).

Responsive to the pulse on the change command pulse signal and a falling clock edge, the comparator 236 resets (at time 817) the ID_MATCH signal to a logical LOW level.

Contemporaneously, the ID register 234 obtains, from the data input buffer 202, the memory component identifier present in the second command packet. The ID register 234 decodes the memory component identifier and passes a command ID value, which has been decoded from the memory component identifier, to the comparator 236. The comparator 236 also receives a device ID from the memory 238 and compares the command ID value received from the ID register 234 to the device ID received from the memory 238.

Upon the falling edge of the clock signal following the end of the change command pulse signal (at time 818), the comparator 236 produces either a logical HIGH level or a logical LOW level as the ID_MATCH signal. The comparator 236 produces a logical LOW level for the ID_MATCH signal when the command ID value received from the ID register 234 does not match the device ID received from the memory 238. It is assumed, for illustration purposes in FIG. 8, that the memory component identifier in the second command packet does not correspond to the example memory component 104. Accordingly, the comparator 236 maintains the ID_MATCH signal at a logical LOW level.

It should be noted that even though the term MOS (an acronym for Metal Oxide Semiconductor) is used in this description, those skilled in the art will appreciate that any isolated-gate field-effect transistor technology may be used for practicing the present invention.

The above-described embodiments of the present application are intended to be examples only. Alterations, modifications and variations may be effected to the particular embodiments by those skilled in the art without departing from the scope of the application, which is defined by the claims appended hereto.

What is claimed is:

1. A serial-connected memory system comprising:
    a serial-connected memory component including:
        a plurality of input components;
        a plurality of output components;
        a plurality of core components;
        a control circuit adapted to, responsive to receiving a predetermined signal, place said plurality of core components into a low power consumption operational mode, while leaving said plurality of input components and said plurality of output components in an active operational mode; and
        a comparator adapted to generate said predetermined signal responsive to determining that an identification value associated with said memory component does not match an identification value decoded from a memory component identifier present in a received command packet.

2. The serial-connected memory system of claim 1 wherein said control circuit produces a core drain supply voltage.

3. The serial-connected memory system of claim 2 wherein said core drain supply voltage is associated with:
    a first drain supply voltage level corresponding to a core active operational mode; and
    a second drain supply voltage level, wherein a magnitude of said second drain supply voltage level is lesser than a magnitude of said first drain supply voltage level, said second drain supply voltage level corresponding to said low power consumption operational mode; and wherein, responsive to said predetermined signal, said control circuit is adapted to reduce said core drain supply voltage from said first drain supply voltage level to said second drain supply voltage level.

4. The serial-connected memory system of claim 1 wherein said control circuit produces a core source supply voltage.

5. The serial-connected memory system of claim 4 wherein said core source supply voltage is associated with:
- a first source supply voltage level corresponding to a core active operational mode; and
- a second source supply voltage level, wherein a magnitude of said second source supply voltage level is greater than a magnitude of said first source supply voltage level, said second source supply voltage level corresponding to said low power consumption operational mode; and
- wherein, responsive to said predetermined signal, said control circuit is adapted to increase said core source supply voltage from said first source supply voltage level to said second source supply voltage level.

6. The serial-connected memory system of claim 1 wherein said control circuit is adapted to reverse-bias said plurality of core components.

7. The serial-connected memory system of claim 6 wherein said control circuit is adapted to reverse-bias said plurality of core components according to a gate-source reverse-biasing scheme.

8. The serial-connected memory system of claim 7 wherein said control circuit is adapted to employ a gate voltage control with a fixed source voltage category of said gate-source reverse-biasing scheme.

9. A method of managing an operational mode of memory component in a serial-connected memory system, said method comprising:
- receiving a command, wherein said command includes a memory component identifier;
- decoding said memory component identifier to obtain a command identification value;
- obtaining a stored identification value associated with said memory component;
- determining that said stored identification value does not match said command identification value; and
- responsive to said determining, placing a plurality of core components of said memory component in a low power consumption mode.

10. The method of claim 9 wherein said placing said plurality of core components of said memory component in a low power consumption mode comprises reducing a core drain supply voltage from a first drain supply voltage level to a second drain supply voltage level.

11. The method of claim 10 wherein said reducing acts to reverse-bias a subset of said plurality of core components.

12. The method of claim 11 wherein said reverse-bias is implemented according to a gate-source reverse-biasing scheme.

13. The method of claim 12 wherein said reverse-bias employs a gate voltage control with a fixed source voltage category of said gate-source reverse-biasing scheme.

14. The method of claim 9 wherein said placing said plurality of core components of said memory component in a low power consumption mode comprises increasing a core source supply voltage from a first source supply voltage level to a second source supply voltage level.

15. The method of claim 14 wherein said increasing acts to reverse-bias a subset of said plurality of core components.

16. The method of claim 15 wherein said reverse-bias is implemented according to a gate-source reverse-biasing scheme.

17. The method of claim 16 wherein said reverse-bias employs a gate voltage control with a fixed source voltage category of said gate-source reverse-biasing scheme.

* * * * *